United States Patent [19]  [11] 4,358,742
Ferriss  [45] Nov. 9, 1982

[54] TRANSIMPEDANCE OSCILLATOR HAVING HIGH GAIN AMPLIFIER

[75] Inventor: Lincoln S. Ferriss, Lincoln Park, N.J.

[73] Assignee: The Singer Company, Little Falls, N.J.

[21] Appl. No.: 128,020

[22] Filed: Mar. 7, 1980

[51] Int. Cl.³ .................................................. H03B 5/32
[52] U.S. Cl. ................................. 331/158; 331/108 D
[58] Field of Search ........ 331/108 D, 116 R, 116 FE, 331/158, 159, 175

[56] References Cited

U.S. PATENT DOCUMENTS

| | | | |
|---|---|---|---|
| 2,303,862 | 12/1942 | Peterson | 331/159 |
| 2,985,845 | 5/1961 | Anderson et al. | 331/159 |
| 3,731,230 | 5/1973 | Cerny, Jr. | 331/116 R |
| 3,767,946 | 10/1973 | Berger et al. | 331/158 X |

Primary Examiner—Siegfried H. Grimm
Assistant Examiner—Edward P. Westin
Attorney, Agent, or Firm—Morris Liss; Thomas W. Kennedy

[57] ABSTRACT

A transimpedance amplifier is connected in a positive regenerative loop with a crystal resonator. The transimpedance amplifier includes a high gain amplifier with a parallel resistor and capacitor thereacross. A virtual ground is created at the node between the resonator and the amplifier input thereby eliminating circuit sensitivity to inherent capacitive changes between the resonator and true ground. Components are chosen to maintain oscillations at series resonance and achieve insensitivity to changes in the motional resistance of the resonator.

13 Claims, 9 Drawing Figures

TRANSIMPEDANCE OSCILLATOR HAVING HIGH GAIN AMPLIFIER

FIELD OF THE INVENTION

The present invention relates to oscillators and more particularly to crystal oscillators.

BACKGROUND OF THE INVENTION

Piezoelectric crystals are used extensively as the frequency-determining element (resonator) in oscillator circuits. The properties of piezoelectric crystals especially those of quartz are stable and produce oscillators with predictable frequencies of oscillation.

Figure 1:
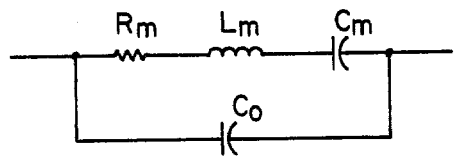
FIG. 1 is an equivalent electrical diagram for a crystal resonator.

The equivalent electrical circuit for a crystal resonator is shown in FIG. 1. Those elements with a subscripted "m" are motional quantities derived in part from piezoelectric properties of the resonator. The capacitance Co is a static quantity formed by the plating of the electrodes forming a pair of terminals separated by a dielectric, namely that of the piezoelectric material itself. Several properties of the resonator may be expressed in terms of the elements of the equivalent circuit.

The frequency of series resonance, $\omega_o$, of the branch in FIG. 1 including $L_m$ and $C_m$, is given by:

$$\omega_o = \frac{1}{\sqrt{L_m C_m}} \qquad \text{Eq. 1}$$

The quality factor, Q, is expressed as:

$$Q = \frac{\omega_o L_m}{R_m} = \frac{1}{\omega_o R_m C_m} \qquad \text{Eq. 2}$$

and the figure of merit, M, is:

$$M = Q \frac{C_m}{C_o} \qquad \text{Eq. 3}$$

For crystals having figures of merit M greater than 2, an antiresonant frequency may be defined as:

$$\omega_a = \frac{1}{\sqrt{L_m \left( \frac{C_m C_o}{C_m + C_o} \right)}} \qquad \text{Eq. 4}$$

This antiresonant frequency, when defined, is close to and slightly higher than $\omega_o$. The region between $\omega_o$ and $\omega_a$ on a resonator impedance versus frequency plot is termed the region of positive reactance since the resonator appears inductive at those frequencies.

Figure 2:
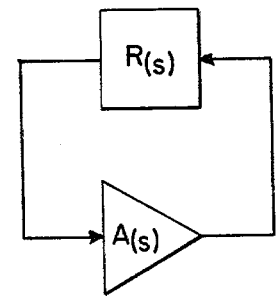
FIG. 2 is a generalized oscillator circuit shown in block diagram form.

The generalized oscillator circuit is shown in FIG. 2. The block $R_{(s)}$ (transfer function in LaPlace notation) is the frequency-determining portion of the oscillator and consists of the resonator and often other circuit elements intended to permit neutralization or frequency trim. The block $A_{(s)}$ supplies energy to the system to sustain oscillations and contains an amplifier and often circuit elements associated with amplitude control. The requirement to sustain steady-state sinusoidal oscillations is met when the condition.

$$R(j\omega) A(j\omega) = 1 + jO \qquad \text{Eq. 5}$$

is satisfied.

BRIEF DESCRIPTION OF THE PRIOR ART

Most piezoelectric crystals, especially those designed a frequency standards, operate in the positive reactance region. The well-known Pierce-Miller oscillator is representative of that type.

Where greater frequency stability is required or where the figure of merit of the desired mode of oscillation is small so as to preclude operation as a positive reactance oscillator, bridge type oscillators can be used. Bridge oscillators have been explored in the prior art. An example of their use is disclosed in U.S. Pat. No. 3,479,536.

Figure 3:
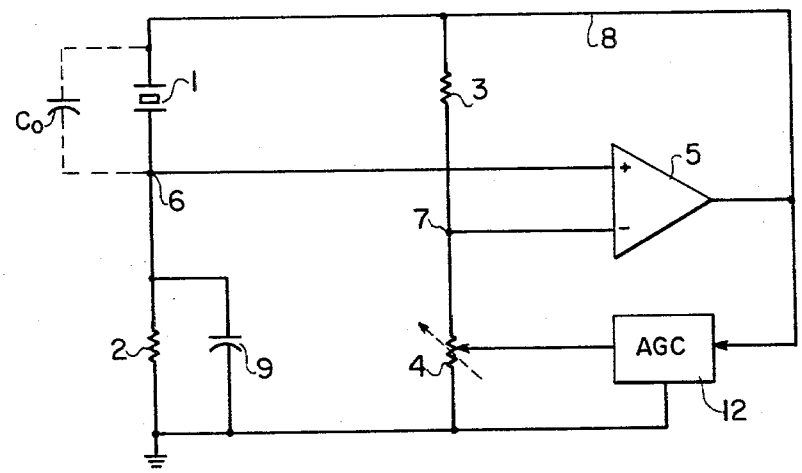
FIG. 3 is a prior art bridge oscillator.
Figure 4:
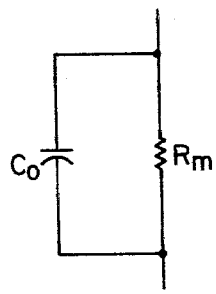
FIG. 4 is an equivalent electrical circuit of a crystal resonator at series resonance.

A typical bridge oscillator is shown in FIG. 3. The crystal resonator 1 is in series with fixed resistor 2 comprising one arm of the bridge. The second arm is made up of fixed resistor 3 and controlled resistor 4. The controlled resistor 4 is often a lamp having a large positive temperature coefficient of resistance, or, in more recent applications, the drain-source resistance of a field-effect transistor, the gate of which is operated from a control voltage generated by an automatic gain control (AGC) circuit 12. Differential amplifier 5 is supplied with the signals at nodes 6 and 7 and it drives the bridge at node 8. At series resonance the crystal 1 appears as a resistor $R_m$, the motional resistance, and $C_o$, the static capacitance of the crystal connected in parallel as shown in FIG. 4. In order to achieve oscillations at the frequency of series resonance, a small capacitor 9 may be added in parallel with fixed resistor 2 such that the RC product is equal to $R_m C_o$. In this circuit amplitude control is effected by AGC circuit 12 and resistor 4 so as to cause the voltage amplitude at node 8 to remain constant. For high figure-of-merit crystals the frequency sensitivity to phase shift in the loop is approximately $$\frac{\Delta \omega}{\omega_o} = -\frac{1}{2Q} \Delta \phi \qquad \text{Eq. 6}$$

where $\Delta\omega = \omega - \omega_o$ = frequency change from series resonance Q = crystal quality factor $\Delta\phi$ = small change in phase shift in bridge or amplifier.

The circuit of FIG. 3 is sensitive to changes in capacitance from nodes 6 and 7 to ground as well as from nodes 6 to 8 and 7 to 8 and also to changes in the value of $R_m$ of the resonator. The changes in capacitance may be due to changes in temperature, moisture and aging of components.

The frequency sensitivity to capacitance arises in that a change in capacitance between node 6 and ground produces a change in phase $\Delta\phi$ of the branch comprised of resistor 2 and capacitor 9. In order to satisfy the requirement that the phase shift around the oscillator loop be zero (Equation 5), the frequency of oscillation must change by an amount $\Delta\omega$ as given in Equation 6.

The frequency sensitivity to changes in $R_m$ arises in that the phase angle of the resonator at its frequency of series resonance is given by:

$$\phi_R = \tan^{-1}(-\omega_o R_m C_o) \qquad \text{Eq. 7}$$

For a change of $R_m$, $\phi_R$ changes as given by Equation 7.

To satisfy the condition for steady state oscillations (equation 5), the frequency of oscillation must change by an amount $\Delta\omega$ as given by Equation 6.

Figure 5:
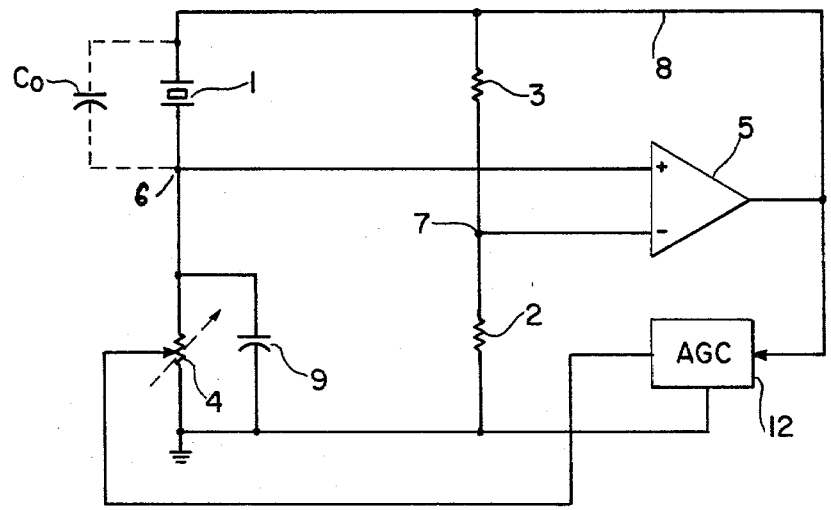
FIG. 5 is an electrical schematic diagram of an improved bridge oscillator constituting prior art.

In an improved bridge oscillator, shown in FIG. 5, the fixed resistor 2 and the amplitude control resistor 4 are interchanged. This circuit, although still sensitive to changes in capacitance from node 6 to ground to the same degree as the circuit of FIG. 3, it is insensitive to changes of $R_m$. This insensitivity arises in that a change in $R_m$ produces a proportional change in the value of resistor 4 due to action of the amplitude control loop which controls resistor 4 to maintain a fixed amplitude of oscillation. Thus, the phase angle of the resonator changes by an amount equal to the phase angle changes of resistor 4 and capacitor 9 causing no net change in the phase of the voltage at node 6 with respect to node 8, much in the way a compensated attenuator produces no phase shift between output and input. Since $\Delta\phi$ is zero, $\Delta\omega$ is zero and the frequency of oscillation remains coincident with the frequency of series resonance of the crystal.

BRIEF DESCRIPTION OF THE INVENTION

The present invention utilizes electrical circuits connected in a positive regenerative loop with a crystal resonator. The inventive circuits in the loop with the resonator compensate for changes in motional resistance ($R_m$) in the crystal so that the oscillation frequency is maintained equal to the series resonant frequency of the crystal. Further, the electrical circuitry utilized in conjunction with the resonator must maintain a first terminal thereof at virtual ground thereby eliminating sensitivity to changes in capacitance from that terminal to actual ground.

DETAILED DESCRIPTION OF THE INVENTION

Figure 6:
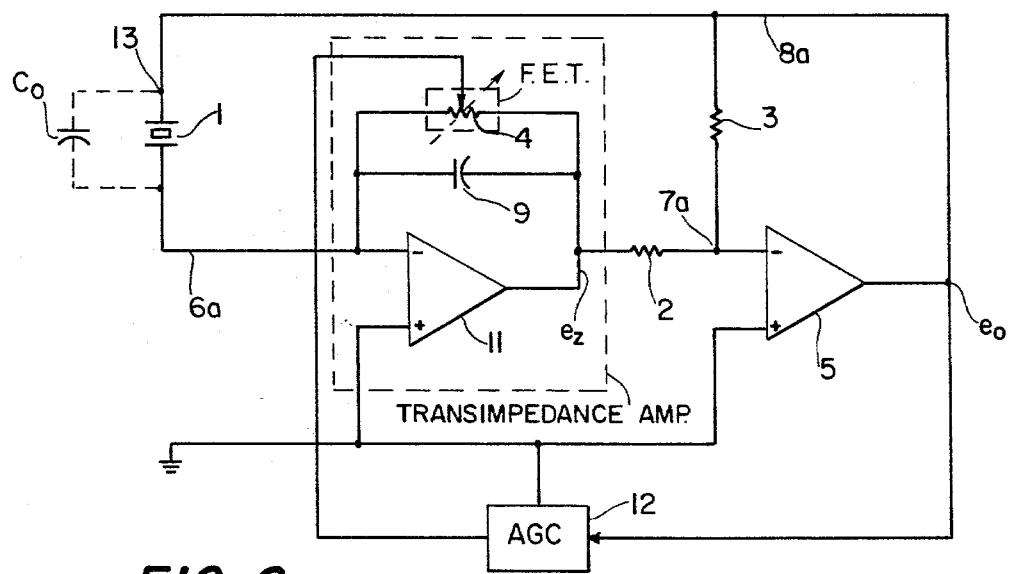
FIG. 6 is an electrical schematic diagram of a transimpedance oscillator in accordance with the present invention.

Referring to FIG. 6 which illustrates the invention in detail, the crystal resonator 1 is shown connected in parallel with the inherent capacitance $C_o$ which, as previously mentioned, is a static quantity formed by the plating of the electrodes forming a pair of terminals and separated by the piezoelectric material itself. This capacitance has been indicated on previous figures. In order to indicate the similarity between components per se, in FIG. 6 and the prior art oscillator of FIG. 5, corresponding numerals have been used throughout. However, the individual components, per se, do not define the invention. Rather, it is the novel combination of these components in conjunction with a transimpedance amplifier which renders patentability to the invention. The transimpedance amplifier achieves the previously mentioned objectives of: maintaining node 6a at a virtual ground as well as introducing impedance compensation in a positive regenerative loop thereby compensating for changes in $R_m$ in the crystal resonator 1. As is well known by those familiar with operational amplifiers, grounding of the positive terminal effectively results in the negative or inverting terminal being at virtual ground. The parallel combination of resistor 4 and capacitor 9 exhibits a phase angle of impedance equal to that of the resonator at frequency $\omega_o$, and the frequency of oscillation, because of zero loop phase shift, is equal to $\omega_o$. The inverting differential amplifier 5, connected in series to the output of the transimpedance amplifier inverts the already inverted output $e_z$ of the transimpedance amplifier so that the original polarity of the signal presented at the input of the transimpedance amplifier is restored for maintaining regenerative feedback in the loop section connected to terminal 13 of the crystal resonator. The automatic gain control (AGC) 12 has its input connected to the output $e_o$ of the amplifier 5 while the output of AGC 12 is connected to the amplitude control element resistor 4, as was the case in the bridge oscillator generally described in connection with FIG. 5. The purpose of AGC 12 is consistent with the oscillators of previous figures. Namely, any current change at the current node 6a due to changes in $R_m$ results in the change of the output voltage $e_o$. This change is detected by AGC 12 which adjusts resistor 4 in a manner to compensate for such change and to restore $e_o$. In the present invention sensitivities to both $R_m$ changes and changes in capacitance from node 6a to ground are eliminated. Since node 6a is a virtual ground, capacitance from node 6a to ground draws no current and thus does not disturb the magnitude or phase of the current entering that node. Voltage at node 8a at frequency $\omega_o$ produces a current into node 6a having a phase angle $\phi_R$ given by Equation 7. With node 6a at virtual ground, all the current entering node 6a also enters the parallel combination of resistor 4 and capacitor 9 which functions as the feedback network of the amplifier. The voltage generated at the output of amplifier 11 is the negative of the current entering node 6a multiplied by the impedance of the parallel combination of resistor 4 (the amplitude control element) and capacitor 9. This gain characteristic is the transimpedance of amplifier 11.

The amplifier 5, formerly connected as a differential amplifier is now connected as an inverting amplifier having a gain given by $$A = -\frac{e_o}{e_z} = -\frac{R3}{R2} \qquad \text{Eq. 8}$$

In the normal operation of this oscillator, circuit capacitor 9 is selected to be equal to $|A|$ multiplied by the value of $C_o$:

$$C9 = |A|C_o \qquad \text{Eq. 9}$$

With this initial adjustment made according to Equation 5, the condition for steady-state oscillations at $\omega = \omega_o$ is $R4 = R_m/|A|$. Thus, the frequency of oscillation is at the series resonant frequency of the crystal and the value of resistor 4, under control of the automatic gain control (AGC) 12, must vary in value so as to be equal to the motional resistance of the crystal divided by the gain of the inverter stage.

A further advantage is obtained in that the requirement for a differential input amplifier is eliminated and thus errors associated with common-mode input effects are eliminated.

These desirable properties obtain under the conditions expressed by Equations 8 and 9, restated here as:

$$\frac{C9}{C_o} = \frac{R3}{R2} \qquad \text{Eq. 10}$$

The accuracy and stability to which these ratios can be made are the limits of the performance of the circuit from the standpoint of the electronics. The ratio R3/R2 can be made quite accurately and with good stability both in terms of temperature and time.

The ratio $C9/C_o$ is more difficult from a stability standpoint. $C_o$ is influenced by the bulk static capacity composed of the crystal dielectric separated by conductive electrodes. In addition, there are lead and wire capacities across the crystal. These capacitances are minimized with the proper use of shielding leaving essentially the bulk static capacity $C_o$. In order to obtain a stable and invariant ratio $C9/C_o$, the capacitors should be formed and processed from identical materials and thus have similar responses to environmental influences. In fact, it would be most desirable that the capacitance C9 share the same dielectric material with $C_o$. This is practical since the capacitors share an electrical terminal in common. A feature of this invention which materially enhances the performance capabilities is a crystal resonator assembly containing C9 as an integral capacitor on the same substrate as the resonator itself thus exposing both capacitors to identical environmental influences hence promoting stability of the ratio $C9/C_o$ in view of temperature changes and aging effects.

Figure 7:
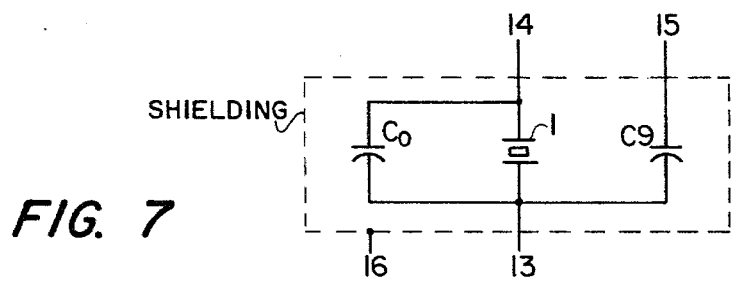
FIG. 7 is an electrical schematic diagram showing a crystal resonator with an integral compensation capacitor.

A schematic representation showing the inventive circuitry within a shielded case 16 is shown in FIG. 7. Here, the crystal resonator 1 and its associated $C_o$ are between terminals 13 and 14 and the compensation capacitor 9 between terminals 13 and 15. Terminal 13 is shared by both capacitances.

Figure 8:
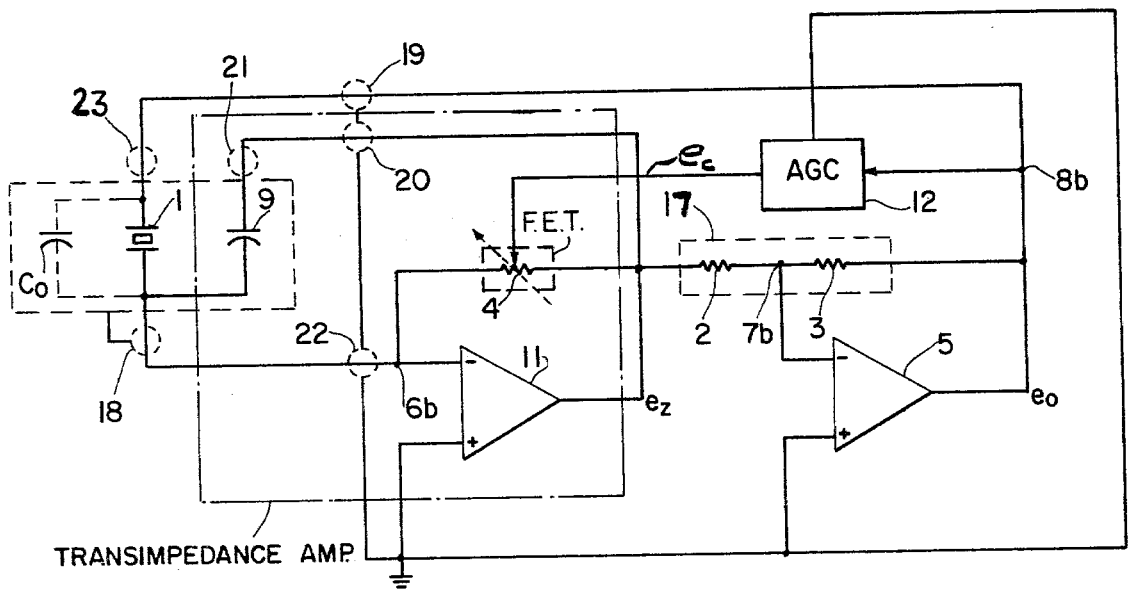
FIG. 8 is an electrical schematic diagram showing a preferred embodiment of the invention wherein certain critical components are formed integrally and shielding added.

A second and preferred embodiment of this invention shown in FIG. 8 permits semi-remote location of the electronics from the crystal resonator 1, and includes an integral compensation capacitor 9 within the crystal resonator housing, which contains the non-detrimental shielding minimizing undesirable capacitance. The components in FIG. 8 correspond to similarly numbered components in FIG. 6. However, the preferred embodiment of FIG. 8 illustrates the relocation of capacitor 9 to an integral relationship with the crystal resonator as just discussed. Further, the amplifier gain-determining resistors 2 and 3 are also relocated to a single structure. The preferred embodiment includes resistors 3 and 2 preferably formed on the same substrate 17 to obtain stability and tracking of the resistance ratio between these resistors 3 and 2. Critical leads in the circuitry of FIG. 8 are shown as shielded by the dotted shielding designations 18–23.

Figure 9:
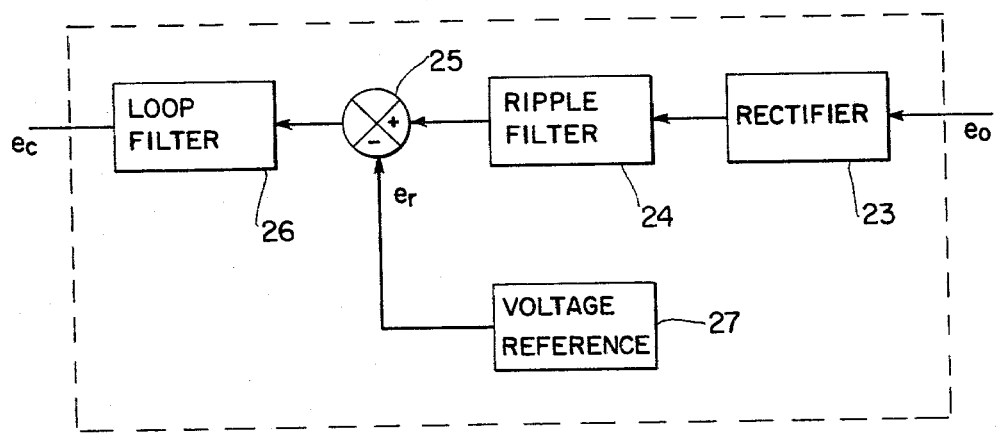
FIG. 9 is a block diagram of an automatic gain control circuit used in the invention.

FIG. 9 illustrates in block form the details of the conventional circuitry for AGC 12 of FIG. 8. The AC output $e_o$ is rectified by rectifier 23 to a DC voltage. Filter 24 removes ripple and the filtered signal is compared to a voltage reference $e_r$. A resulting error voltage is applied to a loop filter, usually containing an integrator. The resultant control voltage $e_c$ is applied to an amplitude control device such as resistor 4 whose resistance is controlled by the value of voltage $e_c$.

Those skilled in the art of automatic gain control systems recognize that such a configuration produces an output voltage $e_c$ which, through the action of controlled resistor 4 (FIG. 8), produces a voltage $e_o$ having an average rectified value equal to the value of the reference voltage $e_r$.

It should be understood that the invention is not limited to the exact details of construction shown and described herein for obvious modifications will occur to persons skilled in the art.

I claim:

1. A transimpedance oscillator comprising:

a crystal resonator having first and second terminals and having a motional resistance ($R_m$);

an operational amplifier having an inverting input, a non-inverting input, and an output, the first terminal of said resonator coupled to the inverting input of said amplifier, the non-inverting input of said amplifier connected to ground to thereby establish a virtual ground at said inverting input to substantially eliminate changes in the frequency of oscillation due to capacitance variations between the inverting terminal and actual ground;

impedance means coupling the inverting input and the output of said operational amplifier for compensating changes in $R_m$ thereby maintaining the frequency of oscillation equal to the frequency of resonator series resonance; and means coupling the output of said operational amplifier and the second resonator terminal in a positive feedback loop between the first resonator terminal and the second resonator terminal.

2. A transimpedance oscillator according to claim 1, wherein the impedance means comprises a parallel combination of resistive and capacitive components.

3. A transimpedance oscillator according to claim 2, wherein said means coupling in a positive feedback loop comprises an inverting amplifier having an input resistor and a feedback resistor with its input resistor coupled to the output of said operational amplifier and its output coupled to said second resonator terminal.

4. A transimpedance oscillator according to claim 3, and further including automatic gain control means for sensing fluctuations in the output voltage of said inverting amplifier coupled to control said impedance means to maintain a constant output voltage from said inverting amplifier.

5. A transimpedance oscillator according to claim 4, wherein said impedance means includes a variable resistive device having a control input coupled to the output of said automatic gain control means and controlled by it for maintaining a constant output voltage at the inverting amplifier, and, in parallel therewith, a capacitor.

6. A transimpedance oscillator according to claim 5, wherein the resistive device is a field-effect device.

7. A transimpedance oscillator according to claim 5, wherein said crystal resonator and said capacitor are physically mounted on a common substrate so as to promote tracking of capacitances.

8. A transimpedance oscillator according to claim 7, and further including a shielded housing surrounding said common substrate to minimize undesired capacitance.

9. A transimpedance oscillator according to claim 7, wherein said input and feedback resistors are formed on a common substrate, the common substrate effecting stability and tracking of the resistance ratio between the resistors.

10. A transimpedance oscillator comprising:
a crystal resonator having first and second terminals;
a high gain operational amplifier having an inverting input, a non-inverting input and an output, the inverting input of said amplifier coupled to the first terminal of the resonator, said non-inverting input grounded for maintaining the inverting input at a virtual ground thereby substantially eliminating the effect of capacitive changes between the inverting terminal and actual ground;
a parallel combination of a capacitor and variable resistive device coupled between the inverting input and the output of said operational amplifier for maintaining a stable frequency of oscillation equal to that of the series resonance of the crystal resonator;
an inverting amplifier having an input resistor and a feedback resistor, said input resistor coupling the inverting amplifier to the output of said operational amplifier for restoring the original polarity of a signal present at the inverting input of said operational amplifier;
means coupling the output terminal of said inverting amplifier to the second terminal of said resonator; and
automatic gain control means having its input coupled to the output of said inverting amplifier for sensing fluctuations of voltage thereat, the output of the automatic gain control means coupled to control said variable resistive device.

11. A transimpedance oscillator according to claim 10, wherein said crystal resonator has a third terminal, said third terminal coupled to the output of said operational amplifier.

12. A transimpedance oscillator according to claim 10, wherein said crystal resonator and said capacitor are physically mounted on a common substrate so as to promote tracking of capacitances.

13. A transimpedance oscillator according to claim 12, wherein said input and feedback resistors are formed on a common substrate, the common substrate effecting stability and tracking of a resistance ratio between the resistors.

* * * * *